(12) United States Patent
Ohori et al.

(10) Patent No.: US 12,334,300 B2
(45) Date of Patent: Jun. 17, 2025

(54) FOCUSED ION BEAM SYSTEM AND METHOD OF CORRECTING DEVIATION OF FIELD OF VIEW OF ION BEAM

(71) Applicant: JEOL Ltd., Tokyo (JP)

(72) Inventors: Yuichiro Ohori, Tokyo (JP); Keiji Tajima, Tokyo (JP)

(73) Assignee: JEOL Ltd., Tokyo (JP)

( * ) Notice: Subject to any disclaimer, the term of this patent is extended or adjusted under 35 U.S.C. 154(b) by 414 days.

(21) Appl. No.: 18/099,127

(22) Filed: Jan. 19, 2023

(65) Prior Publication Data

US 2023/0230801 A1  Jul. 20, 2023

(30) Foreign Application Priority Data

Jan. 20, 2022 (JP) ................................ 2022-007051

(51) Int. Cl.
*H01J 37/304* (2006.01)
*H01J 37/10* (2006.01)
*H01J 37/21* (2006.01)
*H01J 37/305* (2006.01)

(52) U.S. Cl.
CPC ............ *H01J 37/304* (2013.01); *H01J 37/10* (2013.01); *H01J 37/21* (2013.01); *H01J 37/305* (2013.01); *H01J 2237/0492* (2013.01); *H01J 2237/2448* (2013.01); *H01J 2237/30483* (2013.01); *H01J 2237/31749* (2013.01)

(58) Field of Classification Search
CPC .......... H01J 37/10; H01J 37/21; H01J 37/304; H01J 37/305; H01J 37/3053; H01J 2237/0492; H01J 2237/2448; H01J 2237/30483; H01J 2237/31749
See application file for complete search history.

(56) References Cited

U.S. PATENT DOCUMENTS

2015/0136978 A1* 5/2015 Mihira ................ H01J 37/3005
250/307

FOREIGN PATENT DOCUMENTS

JP  201595397 A  5/2015

* cited by examiner

*Primary Examiner* — David E Smith
(74) *Attorney, Agent, or Firm* — The Webb Law Firm

(57) ABSTRACT

An FIB system includes an ion source for producing the ion beam, a lens system which includes an objective lens and which is operative to focus the ion beam onto a sample such that secondary electrons are produced from the sample, a detector for detecting the secondary electrons, and a controller for controlling the lens system. The controller operates i) to provide control so that a focus of the ion beam is varied by directing the ion beam onto the sample, ii) to measure a signal intensity from the secondary electrons produced from the sample during the variation of the strength of the objective lens, iii) to adjust the focus of the ion beam, iv) to acquire a secondary electron image containing an image of a trace of a spot, and v) to correct the deviation of the field of view of the ion beam.

4 Claims, 4 Drawing Sheets

FOCUSED ION BEAM SYSTEM AND METHOD OF CORRECTING DEVIATION OF FIELD OF VIEW OF ION BEAM

CROSS REFERENCE TO RELATED APPLICATION

This application claims priority to Japanese Patent Application No. 2022-007051, filed Jan. 20, 2022, the disclosure of which is hereby incorporated by reference in its entirety.

BACKGROUND OF THE INVENTION

1. Field of the Invention

The present invention relates to a focused ion beam (FIB) system and a method of correcting deviation of the field of view of an ion beam.

2. Description of the Related Art

A known focal adjustment method for use in a focused ion beam (FIB) system involves irradiating a sample with an ion beam without scanning it, varying the strength of the objective lens during the irradiation by the beam, measuring the intensity of signal arising from secondary electrons during the variation of the strength of the objective lens, and adjusting the focus based on the level of the strength of the objective lens which occurs when the measured signal intensity is minimal (see JP-A-2015-95397).

When a focal adjustment is made in an FIB system, the position of the beam taken during milling of the sample and the position of the beam taken during observation of the sample are different and, therefore, the operator adjusts the deviation of the field of view every time.

SUMMARY OF THE INVENTION

In view of the foregoing problem, the present invention has been made. According to some aspects of the present invention, there is provided a focused ion beam (FIB) system capable of automatically correcting deviation of the field of view of an ion beam. Also, there is provided a method of correcting deviation of the field of view of the ion beam.

(1) A focused ion beam system associated with the present invention is adapted to mill a sample by irradiating it with a focused ion beam and includes an ion source for producing an ion beam, a lens system which includes an objective lens having a strength and which is operative to focus the ion beam as the first-mentioned focused ion beam onto the sample such that secondary electrons are produced from the sample, a detector for detecting the secondary electrons, and a controller for controlling the lens system. The controller operates i) to provide control so that a focus of the ion beam is varied by irradiating the sample with the ion beam without scanning while varying the strength of the objective lens, ii) to measure a signal intensity from the secondary electrons produced from the sample during the variation of the strength of the objective lens, iii) to adjust the focus of the ion beam based on a level of the strength of the objective lens which occurs when the measured signal intensity from the secondary electrons is minimal, iv) to acquire a secondary electron image containing an image of a trace of a spot formed on the sample when the focus of the ion beam is adjusted, and v) to correct deviation of the field of view of the ion beam based on the difference between a reference position of the secondary electron image and the position of the trace of the spot.

(2) A method of correcting deviation of a field of view of an ion beam in accordance with the present invention is for use in a focused ion beam system including an objective lens having a strength and comprises the steps of: irradiating a sample with the ion beam without scanning; varying the strength of the objective lens during the irradiation by the ion beam to vary a focus of the ion beam; measuring a signal intensity from secondary electrons emanating from the sample during the variation of the strength of the objective lens; making a focal adjustment of the ion beam based on a level of the strength of the objective lens at which the measured signal intensity from the secondary electrons is minimal; acquiring a secondary electron image containing an image of a trace of a spot formed on the sample during the focal adjustment of the ion beam; and correcting the deviation of the field of view of the ion beam based on the difference between a reference position of the secondary electron image and the position of the trace of the spot.

According to the present invention, the deviation of the field of view can be automatically corrected by utilizing the trace of spot formed on the sample when the focus of the ion beam is adjusted.

In the focused ion beam system associated with the present invention, the controller may acquire the secondary electron image containing the image of the trace of spot formed when the focus of the ion beam is adjusted by scanning a reference beam of a smaller current than the ion beam over the sample after the ion beam of a given current value is adjusted in focus.

In the focused ion beam system associated with the present invention, the controller may acquire the secondary electron image containing the image of the trace of spot formed when the focus of the ion beam is adjusted by scanning the reference beam with a magnification according to the electrical current value of the ion beam after the ion beam of a given current value is adjusted in focus.

DETAILED DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

Figure 1:
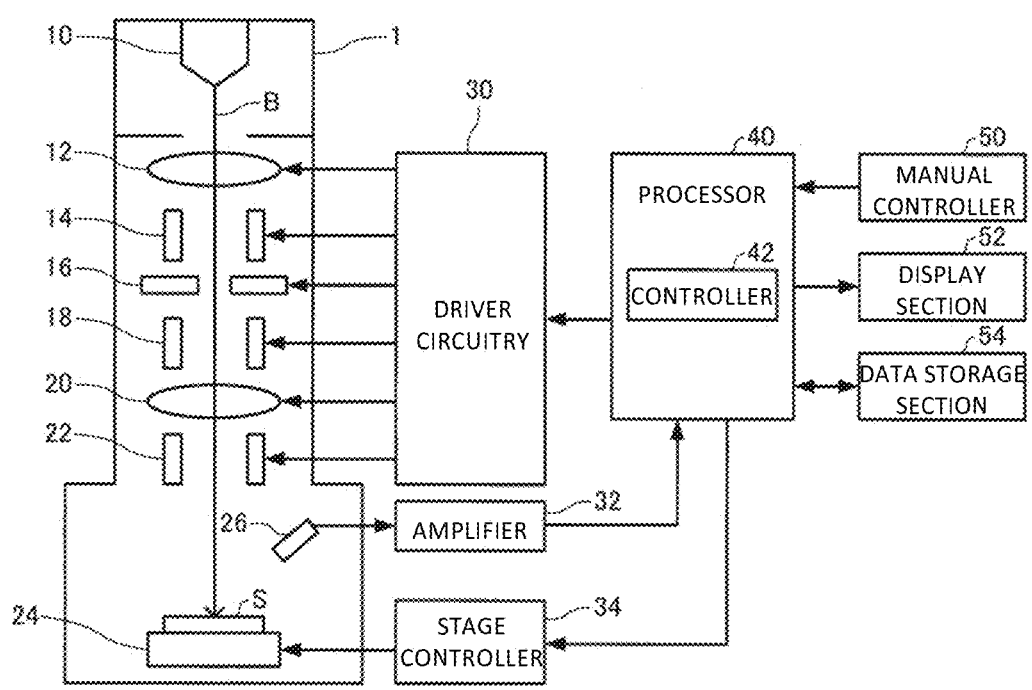
FIG. 1 is a diagram of one example of configuration of a focused ion beam (FIB) system associated with one embodiment of the present invention.

FIG. 1 shows one example of configuration of a focused ion bean (FIB) system associated with one embodiment of the present invention. Note that some of the components of the FIB system of FIG. 1 may be omitted.

As shown in FIG. 1, the FIB system includes an FIB system body 1, driver circuitry 30, an amplifier 32, a stage controller 34, a processor 40, a manual controller 50, a display section 52, and a data storage section 54. The FIB system body 1 includes an ion source 10, condenser lenses 12, a beam blanker 14, a movable aperture 16, an astigmatic corrector (stigmator) 18, an objective lens 20, a beam deflector 22, a support stage 24, and a detector 26.

The ion source 15 emits an ion beam B which in turn is extracted from the ion source 10 by an extraction electrode (not shown) and accelerated by an acceleration electrode (not shown). The condenser lenses 12 operate to focus the ion beam generated from the ion source 10. The beam blanker 14 blanks the ion beam B. The movable aperture 16 selectively restricts the amount of current of the ion beam B. The astigmatic corrector 18 shapes the beam profile such that the cross section of the ion beam B is circular as it hits a target. The objective lens 20 focuses the ion beam B onto the surface of a sample S, and the focused beam B is scanned over the sample S by the beam deflector 22. The support stage 24 moves the sample S horizontally or vertically or rotates or tilts the sample S.

The detector 26 detects secondary electrons produced from the sample S in response to the irradiation by the ion beam B and produces a detection signal representing the intensity of the secondary electrons. The detection signal is amplified by the amplifier 32 and fed to the processor 40.

The driver circuitry 30 energizes the condenser lenses 12, beam blanker 14, movable aperture 16, astigmatic corrector 18, objective lens 20, and beam deflector 22 in response to a control signal from the processor 40. The stage controller 34 controls the operation of the support stage 24 in response to another control signal from the processor 40.

The manual controller 50 permits a user to enter manual control information and outputs the entered manual control information to the processor 40. The function of the manual controller 50 can be implemented by a keyboard, a mouse, buttons, a touch panel display, or other hardware device.

The display section 52 operates to display an image (such as a secondary electron image of the sample S based on the scanning of the focused ion beam B) generated by the processor 40. The function of the display section 52 can be realized by an LCD, a CRT, or the like.

The data storage section 54 stores programs for causing a computer to function as various parts of the processor 40, as well as various kinds of data. The storage section 54 also acts as a working area for the processor 40, and the function of the storage section 54 can be implemented by a hard disk, a RAM, or the like.

The processor 40 operates to control the driver circuitry 30 and the stage controller 34. Also, the processor 40 operates to convert the detection signal amplified by the amplifier 32 into image data (representing a secondary electron image) synchronized with a scanning signal for the ion beam B supplied to the beam deflector 22. The functions of the processor 40 can be implemented by a hardware device (such as various processors (e.g., a CPU, a DSP, and so on) and an ASIC (e.g., a gate array)) or by computer programs. The processor 40 includes the controller 42.

The controller 42 creates a control signal and outputs it to the driver circuitry 30, for controlling the lens system including the condenser lenses 12, beam blanker 14, movable aperture 16, astigmatic corrector 18, objective lens 20, and beam deflector 22.

Furthermore, the controller 42 provides control so that the sample S is irradiated with the ion beam B without scanning it during the focal adjustment of the beam B and that the strength of the objective lens 20 is varied during the irradiation by the ion beam B to vary the focus of the beam B. When the strength of the objective lens 20 is being varied, the controller 42 detects the intensity of signal arising from secondary electrons from the sample S and adjusts the focus of the beam B based on a level of the strength of the objective lens 20 which occurs when the detected signal intensity from the secondary electrons is minimal. That is, the level of the strength of the objective lens 20 which occurs when the detected signal intensity from the secondary electrons is minimal is regarded as the level of the strength of the objective lens 20 when in focus. Alternatively, during milling of the sample, the controller 42 may adjust the focus based on the level of the strength of the objective lens 20 which occurs when the detected signal intensity from the secondary electrons is minimal. During milling of the sample, the controller 42 may adjust the focus based on the level of the strength of the objective lens 20 occurring when the signal intensity responsive to detected secondary electrons is minimal, and during observation of the sample, the controller 42 may adjust the focus based on a value offset a given value from the level of the strength of the objective lens 20 which occurs when the signal intensity from the detected secondary electrons is minimal.

In addition, the controller 42 acquires a secondary electron image containing an image of a trace of a spot formed on the sample S when the focus of the ion beam B is adjusted, and corrects the deviation of the field of view (positional deviation) of the ion beam B based on the difference between the reference position of the secondary electron image (e.g., the central position of the secondary electron image) and the position of the trace of the spot. During adjustment of the focus of the ion beam B, if it is directed as a spot beam at the surface of the sample S without scanning the beam, atoms in the surface of the sample S are sputtered off, resulting in a hole in the surface of the sample S. This hole is referred to as a trace of the spot. The ion beam B differs in electrical current value between when the sample is milled and when it is observed and thus the beam position is different between these two modes of operation. This brings about a deviation of the field of view of the ion beam B. In the technique of the present embodiment, when the focus of the ion beam B is adjusted, the trace of the spot formed on the sample S is observed, and the deviation of the field of view of the beam B is automatically corrected based on the position of the trace of the spot in the observed secondary electron image.

The controller 42 carries out the above-described focal adjustment and correction of the deviation of the field of view while varying the electrical current value of the ion beam B and the acceleration voltage. The controller 42 finds the level of the strength of the objective lens 20 when in focus and correction values for the field of view deviation for each combination of the values of the current and the acceleration voltage and stores the found strength level and correction values in the storage section 54. During milling of the sample, the level of the strength of the objective lens 20 in focus which corresponds to the combination of the values of current and acceleration voltage available at that time is set. Correction values for the deviation of the field of view which correspond to the combination are given to the beam deflector 22 or driver circuitry 30.

Figure 2:
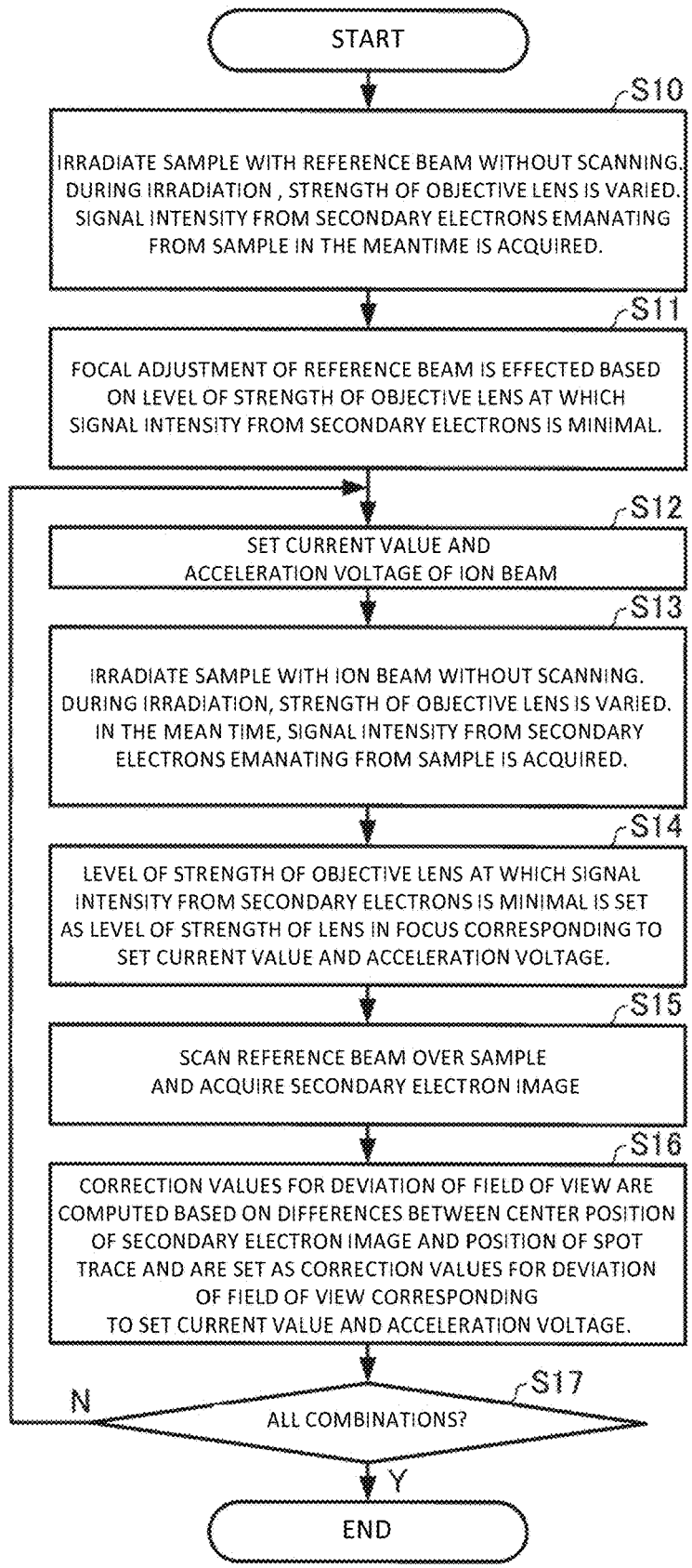
FIG. 2 is a flowchart illustrating a sequence of operations for focal adjustment and correction of field of view deviation performed by the FIB system of FIG. 1.
Figure 3:
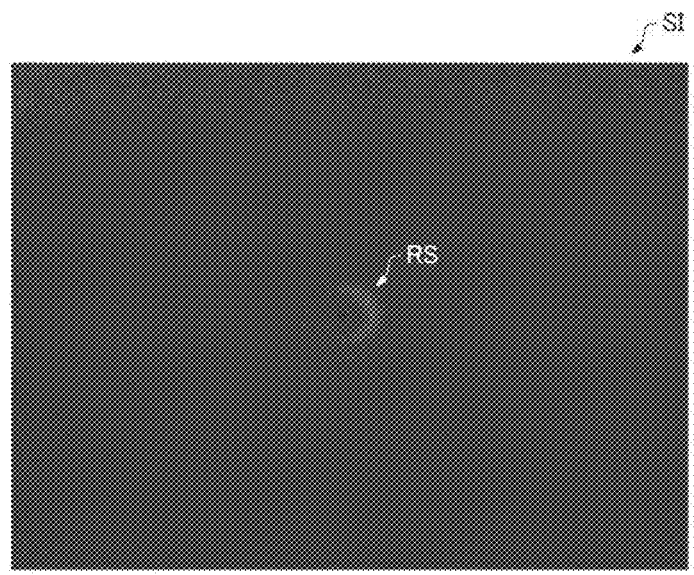
FIG. 3 is a secondary electron image containing a trace of a reference spot.

FIG. 2 is a flowchart illustrating a sequence of operations for focal adjustment and correction of field of view deviations performed by the FIB system of the present embodiment. First, the controller 42 controls the driver circuitry 30 to direct a reference beam, which consists of an ion beam of minimum current to be used during observation of a sample, onto the sample without scanning the beam, and varies the strength of the objective lens 20 during the irradiation by the beam. During the variation of the strength of the objective lens 20, a signal intensity from secondary electrons and supplied from the amplifier 32 is acquired (step S10). The controller 42 then carries out a focal adjustment of the reference beam based on the level of the strength of the objective lens 20 at which the acquired signal intensity from the secondary electrons is minimal (step S11). FIG. 3 shows a secondary electron image SI of an observed trace of a spot formed on the sample when the focal adjustment of the reference beam is made. In this case, the electrical current value of the ion beam is the same for both focal adjustment and observation and so the field of view produces no deviation. The trace of the spot is located at the center of the secondary electron image SI. This trace of the spot is herein referred to as the reference spot trace RS.

Then, the controller 42 controls the power supplies for the movable aperture 16 or driver circuitry 30 and the ion source 10, respectively, to reset the current of the ion beam and the acceleration voltage to any combinations of the values of current and acceleration voltage for focal adjustment and correction of deviations of the field of view (step S12). The used value of current is greater than that of the reference beam.

Then, the controller 42 causes the driver circuitry 30 to irradiate the sample with the ion beam without scanning it. During the irradiation, the strength of the objective lens 20 is varied, and in the meantime, the signal intensity arising from secondary electrons and supplied from the amplifier 32 is acquired (step S13). The level of the strength of the objective lens 20 at which the acquired signal intensity from the secondary electrons is minimal is set as the level of the strength of the objective lens 20 in focus by the controller 42 (step S14). This level of the strength of the objective lens 20 in focus is stored in the storage section 54 in association with the combination of the values of current and acceleration voltage set in step S12.

Then, the controller 42 controls the driver circuitry 30 to acquire a secondary electron image which contains the image of the trace of the spot formed during focal adjustment of step S11 by scanning the reference beam over the sample (step S15). At this time, the controller 42 scans the reference beam with a magnification (i.e., the final magnification) according to the electrical current value set at step S12. The trace of spot formed during the focal adjustment increases with increasing electrical current value of the ion beam and, therefore, the size of the image of the trace of the spot in the secondary electron image is kept constant irrespective of the current of the ion beam by decreasing the final magnification with increasing ion beam current. Consequently, the trace of the spot can be recognized with greater ease in step S16 described later.

Figure 4:
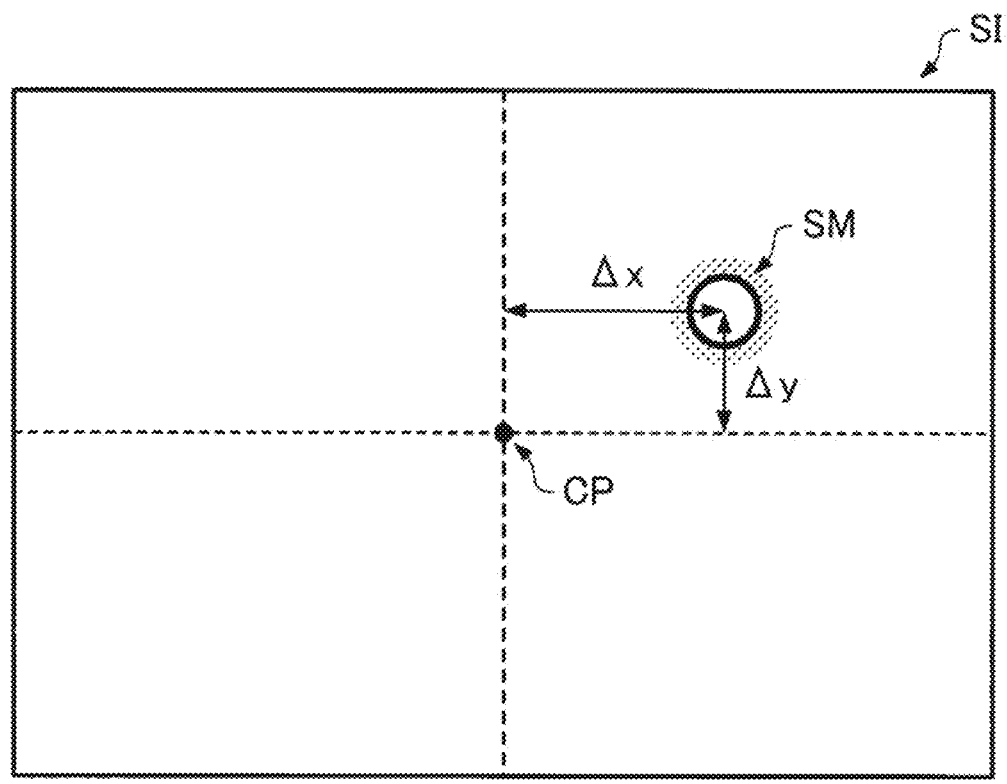
FIG. 4 is a schematic representation of a secondary electron image containing a trace of a spot.
Figure 5:
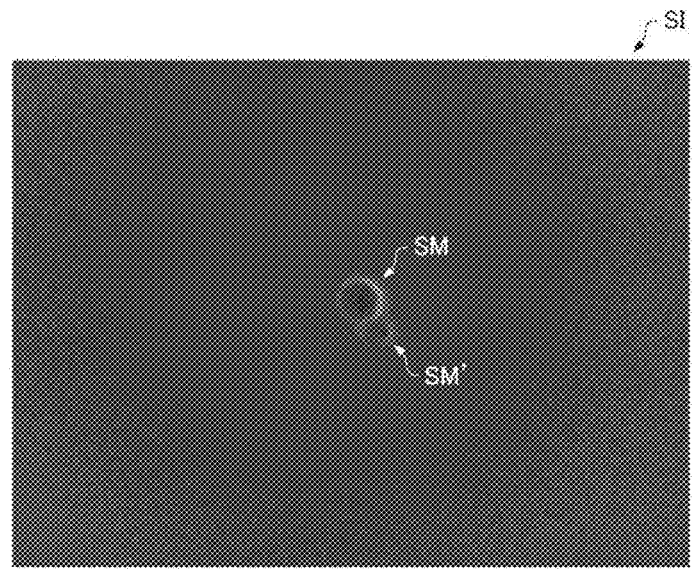
FIG. 5 is a secondary electron image containing a trace of a spot.
Figure 6:
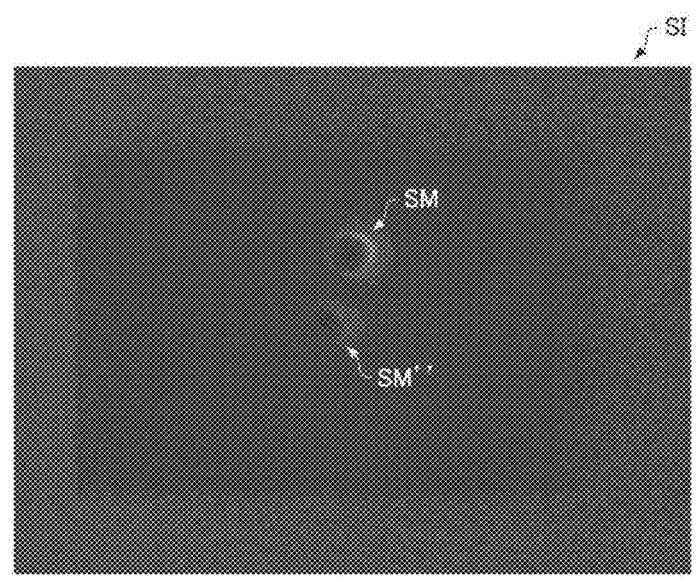
FIG. 6 is another secondary electron image containing a trace of a spot.

Then, the controller 42 finds the difference between the center position of the acquired secondary electron image (one example of a reference position) and the position of the trace of the spot, and correction values for the field of view deviation are set based on the found difference (step S16). The correction values for the field of view deviation are stored in the storage section 54 in association with the combination of the values of current and acceleration voltage set in step S12. FIG. 4 schematically shows the secondary electron image SI containing a trace of a spot SM. The difference between the center position CP of the secondary electron image SI and the position of the spot trace SM is herein represented by both the distance ($\Delta x$) between the center position CP and the spot trace SM taken along the X axis and the distance ($\Delta y$) between them but taken along the Y axis. The amounts of positional deviations ($\Delta X$, $\Delta Y$) of the ion beam are found based on the x-axis and y-axis distances ($\Delta x$, $\Delta y$) and on the final magnification and inverted in sign, resulting in correction values ($-\Delta X$, $-\Delta Y$) for the deviations of the field of view. The correction values ($-\Delta X$, $-\Delta Y$) are supplied to the beam deflector 22, thus correcting the deviations of the field of view of the beam. The distances ($\Delta x$, $\Delta y$) between the center position CP and the spot trace SM may be found by image recognizing the spot trace SM and identifying its position. Furthermore, the distances may be found by performing pattern matching between the secondary electron image (FIG. 3) containing the reference spot trace RS and the secondary electron image SI containing the spot trace SM. In this example, as shown in FIGS. 5 and 6, the secondary electron image SI may contain an image of a spot trace formed in a focal adjustment made in the past with an electrical current value different from the present electrical current value, as well as the spot trace SM formed in a focal adjustment made immediately previously with the present electrical current value. In the example of FIG. 5, a spot trace SM' formed in a focal adjustment made in the past is sufficiently smaller as compared to the spot trace SM. Therefore, in image recognition or pattern matching, the spot trace SM' can be neglected and the distances ($\Delta x$, $\Delta y$) can be found without problems. In the example shown in FIG. 6, a spot trace SM" formed in a focal adjustment made in the past is comparable in size to the spot trace SM but the spot trace SM" is lower in brightness than the spot trace SM. Therefore, in image recognition or pattern matching, the spot trace SM of higher brightness is recognized and the distances ($\Delta x$, $\Delta y$) can be found without problems.

The controller 42 then makes a decision as to whether a focal adjustment and a correction of deviations of the field of view have been performed for all combinations of the values of the current of the ion beam and acceleration voltage (step S17). If the decision of step S17 is negative (N), indicating that the operations are not completed for all the combinations, control proceeds to step S12, where step S13 and subsequent steps are executed with other combinations of the values of current and acceleration voltage.

The image of the spot trace contained in the secondary electron image acquired in step S15 may be stored in the storage section 54 in association with temporal information about the acquisition and be managed. In this case, the controller 42 may refer to the images of spot traces already stored in the storage section 54 and estimate the degree of wear-out of the aperture (movable aperture 16) and the time for replacement based on the shapes of these stored spot traces. For example, the degree of difference between the shape of any one of these spot traces and the shape of a reference spot trace whose aperture is not worn out and which is contained in a previously obtained secondary electron image is found. The degree of wear-out of the aperture or time for replacement may be estimated in such a way that as the degree of difference increases, the estimated degree of wear-out increases or the estimated time for replacement comes closer. Furthermore, if the degree of difference exceeds a given threshold value, the controller may deliver alert information to inform the user that the maintenance period has arrived or there is a trouble.

It is to be understood that the present invention is not restricted to the foregoing embodiments but rather can be implemented in variously modified forms. The present invention embraces configurations (e.g., configurations identical in function, method, and results or identical in purpose and advantageous effects) which are substantially identical to the configurations described in the above embodiments. Furthermore, the invention embraces configurations which are similar to the configurations described in the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

The invention claimed is:

1. A focused ion beam system for irradiating a sample with a focused ion beam to mill the sample, said focused ion beam system comprising:
   an ion source for producing an ion beam;
   a lens system which includes an objective lens having a strength and which is operative to focus the ion beam as the focused ion beam onto the sample such that secondary electrons are produced from the sample;
   a detector for detecting the secondary electrons; and
   a controller for controlling the lens system;
   wherein the controller operates i) to provide control so that a focus of the ion beam is varied by directing the ion beam onto the sample without scanning while varying the strength of the objective lens, ii) to measure a signal intensity from the secondary electrons produced from the sample during the variation of the strength of the objective lens, iii) to adjust the focus of the ion beam based on a level of the strength of the objective lens which occurs when the measured signal intensity from the secondary electrons is minimal, iv) to acquire a secondary electron image containing an image of a trace of a spot formed on the sample when the focus of the ion beam is adjusted, and v) to correct deviation of a field of view of the ion beam based on a difference between a reference position of the secondary electron image and a position of the trace of the spot.

2. The focused ion beam system as set forth in claim 1, wherein after the focus of the ion beam of a given electrical current value is adjusted, said controller acquires said secondary electron image containing the image of said trace of the spot formed when the focus of the ion beam is adjusted by scanning a reference beam of a lower current than said ion beam over the sample.

3. The focused ion beam system as set forth in claim 2, wherein after the focus of the ion beam of the given electrical current value is adjusted, said controller acquires said secondary electron image containing the image of said trace of the spot formed when the focus of the ion beam is adjusted by scanning said reference beam at a magnification according to the electrical current value of said ion beam.

4. A method of correcting deviation of a field of view of an ion beam in a focused ion beam system comprising an objective lens having a strength, said method comprising the steps of:
   irradiating a sample with the ion beam without scanning while varying the strength of the objective lens to vary a focus of the ion beam, measuring a signal intensity from secondary electrons emanating from the sample during the variation of the strength of the objective lens, and making a focal adjustment of the ion beam based on a level of the strength of the objective lens at which the measured signal intensity from the secondary electrons is minimal; and
   acquiring a secondary electron image containing an image of a trace of a spot formed on the sample during the focal adjustment of the ion beam and correcting the deviation of the field of view of the ion beam based on a difference between a reference position of the secondary electron image and a position of the trace of the spot.

* * * * *